US008290086B2

(12) United States Patent
Bose et al.

(10) Patent No.: US 8,290,086 B2
(45) Date of Patent: Oct. 16, 2012

(54) EFFICIENT OUTPHASING TRANSMITTER

(76) Inventors: Tamal Bose, Blacksburg, VA (US);
Xuetao Chen, Blacksburg, VA (US);
Jeffery H. Reed, Blacksburg, VA (US)

( * ) Notice: Subject to any disclaimer, the term of this patent is extended or adjusted under 35 U.S.C. 154(b) by 172 days.

(21) Appl. No.: 12/634,251

(22) Filed: Dec. 9, 2009

(65) Prior Publication Data
US 2011/0135035 A1 Jun. 9, 2011

(51) Int. Cl.
*H04L 27/04* (2006.01)
*H04L 27/20* (2006.01)
(52) U.S. Cl. ............ 375/298; 375/300; 375/308
(58) Field of Classification Search .......... 375/295, 375/297, 298, 300, 303, 305, 308; 455/91, 455/108; 329/100, 103–105, 144–145, 149, 329/151
See application file for complete search history.

(56) References Cited

U.S. PATENT DOCUMENTS

| | | | | |
|---|---|---|---|---|
| 5,633,893 | A * | 5/1997 | Lampe et al. | 375/297 |
| 7,279,971 | B2 | 10/2007 | Hellberg et al. | |
| 7,394,869 | B2 * | 7/2008 | Jensen et al. | 375/302 |
| 7,469,017 | B2 * | 12/2008 | Granstrom et al. | 375/295 |
| 7,573,948 | B2 * | 8/2009 | Jensen | 375/295 |
| 7,929,637 | B2 * | 4/2011 | Staszewski et al. | 375/295 |
| 2004/0218683 | A1 * | 11/2004 | Batra et al. | 375/261 |
| 2009/0285137 | A1 * | 11/2009 | Fujita et al. | 370/310 |
| 2010/0075615 | A1 * | 3/2010 | Ma | 455/73 |
| 2011/0051783 | A1 * | 3/2011 | Cahn et al. | 375/146 |

OTHER PUBLICATIONS

Chen et al., A High Efficiency Outphasing Transmitter Structure for Wireless Communications, 2009, Digital signal Processing Workshop and 5$^{th}$ IEEE Signal Processing Education Workshop, 2009. DSP/SPE 2009. IEEE 13$^{th}$, pp. 348-352.*

Chireix, "High power outphasing modulation," Proc. Institute of Radio Engineers, Nov. 1935, pp. 1370-1392, vol. 23, No. 11, New York City, USA.

Pham, "Outphase power amplifiers in OFDM systems," PhD Dissertation, MIT, Sep. 2005, pp. 21-22, Massachusetts, USA.

Zhang, "An improved outphasing power amplifier system for wireless communications," PhD Dissertation, University of California, 2001, pp. 87-147, San Diego, USA. [Month of publication is unknown. The year of publication is sufficiently earlier than the effective U.S. filing date and any foreign priority date so the particular month of publication is not in issue.].

Zhang, et al., "Analysis of power recycling techniques for RF and microwave outphasing power amplifiers," IEEE Trans. Circuits Syst.-II: Analog and Digital Signal Processing, May 2002, pp. 312-320, vol. 49, No. 5, New York City, USA.

Jheng, et al., "Multilevel LINC system design for power efficiency enhancement," IEEE Workshop Signal Processing Systems, Oct. 2007, pp. 31-34, New York City, USA.

Pham, et al., A digital amplitude-to-phase conversion for high efficiency linear outphase power amplifiers, Proc. IEEE ICASSP '06, May 2006, pp. 97-100, vol. 4, New York City, USA.

Raab, Efficiency of outphasing RF poweramplifier systems, IEEE Trans. Commun., Oct. 1985, pp. 1094-1099, vol. 33, No. 10, New York City, USA.

(Continued)

*Primary Examiner* — Lawrence B Williams

(57) ABSTRACT

Techniques for producing an output signal using an outphasing transmitter are disclosed. In some examples, constant modulation (CM) signals may be produced from a digital input signal. The CM signals may be converted to an analog state and filtered. The signals may then be modulated to produce modulated signals, which may be amplified. The amplified signals may be combined to produce combined signals, which may further be combined to produce an output signal.

20 Claims, 4 Drawing Sheets

OTHER PUBLICATIONS

Stengel, et al., LINC power amplifier combiner method efficiency optimization, IEEE Trans. Veh. Technol., Jan. 2001, pp. 229-234, vol. 49, No. 1, New York City, USA.

Bauml, et al., Reducing the peak-to-average power ratio of multicarrier modulation by selected mapping, IEEE Electron Lett., Oct. 1996, pp. 2056-2057, vol. 32, No. 22, New York City, USA.

Reynaert, et al., RF power amplifiers for mobile communications, 2006, pp. 118-125, Chapter 4, Springer, Germany. [Month of publication is unknown. The year of publication is sufficiently earlier than the effective U.S. filing date and any foreign priority date so the particular month of publication is not in issue.].

Rizzi, Microwave Engineering: Passive Circuits, 1988. pp. 367-369, Prentice Hall, New York City, USA. [Month of publication is unknown. The year of publication is sufficiently earlier than the effective U.S. filing date and any foreign priority date so the particular month of publication is not in issue.].

Pozar, Microwave Engineering (2nd edition), 1998, pp. 354-367, John Wiley & Sons, USA. [Month of publication is unknown. The year of publication is sufficiently earlier than the effective U.S. filing date and any foreign priority date so the particular month of publication is not an issue.].

Chen et al., "A High Efficiency Outphasing Transmitter Structure for Power Amplifiers," Digital Signal Processing Workshop and 5th IEEE Signal Processing Education Workshop, 2009. DSP/SPE 2009. IEEE 13th, Jan. 2009, pp. 348-352, IEEE, New York, NY, USA.

Fehske et al., "A New Approach to Signal Classification Using Spectral Correlation and Neural Networks," 2005, pp. 144-150, Virginia Polytechnic Institute and State University, Blacksburg, Virginia, USA. [Month of publication is unknown. The year of publication is sufficiently earlier than the effective U.S. filing date and any foreign priority date so the particular month of publication is not in issue.].

Gardner, William A., "Measurement of Spectral Correlation," IEEE Transactions on Acoustics, Speech, and Signal Processing, Oct. 1986, pp. 1111-1123, vol. 34, No. 5, IEEE, New York, NY, USA.

Gardner et al., "Signal Interception: Performance Advantages of Cyclic-Feature Detectors," IEEE Transactions on Communications, Jan. 1992, pp. 149-159, vol. 40, No. 1, IEEE, New York, NY, USA.

Haykin, Simon, "Cognitive Radio: Brain-Empowered Wireless Communications," IEEE Journal on Selected Areas in Communications, Feb. 2005, pp. 201-220, vol. 23, No. 2, IEEE, New York, NY, USA.

Godard, Dominique N., "Self-Recovering Equalization and Carrier Tracking in Two-Dimensional Data Communication Systems," IEEE Transactions on Communications, Nov. 1980, pp. 1867-1875, vol. 28, No. 11, IEEE, New York, NY, USA.

Kim et al., "Cylostationary Approaches to Signal Detection and Classification in Cognitive Radio," in Proc. IEEE Dynamic Spectrum Access Nets., 2007, pp. 212-215, IEEE, New York, NY, USA. [Month of publication is unknown. The year of publication is sufficiently earlier than the effective U.S. filing date and any foreign priority date so the particular month of publication is not in issue.].

Li et al., "On Blind Equalization of MIMO Channels", IEEE International Conference on Communications, 1996, pp. 1000-1004, vol. 2, IEEE, New York, NY, USA. [Month of publication is unknown. The year of publication is sufficiently earlier than the effective U.S. filing date and any foreign priority date so the particular month of publication is not in issue.].

Radenkovic et al., "Blind Adaptive Equalizer for IIR Channels With Common Zeros", IEEE, 2006, pp. 4195-4198, IEEE, New York, NY, USA. [Month of publication is unknown. The year of publication is sufficiently earlier than the effective U.S. filing date and any foreign priority date so the particular month of publication is not in issue.].

Radenkovic et al., "A Recursive Blind Adaptive Equalizer for IIR Channels. with Common Zeros,", Circuits System Signal Process, Jan. 2009, pp. 467-486, Birkhäuser Boston. [City/country of publication is unknown.].

Roberts et al., "Computationally Efficient Algorithms for Cyclic Spectral Analysis," IEEE Signal Processing Magazine, Apr. 1991, pp. 38-49, vol. 8, Issue 2, IEEE, New York, NY, USA.

Swami et al., "Hierarchical Digital Modulation Classification Using Cumulants," IEEE Transactions on Communications, Mar. 2000, pp. 416-429, vol. 48, No. 3, IEEE, New York, NY, USA.

Treichler et al., "New Processing Techniques Based on the Constant Modulus Adaptive Algorithm," IEEE Transactions on Acoustics, Speech and Signal Processing, Apr. 1985, pp. 420-431, vol. 33, Issue 2, IEEE, New York, NY, USA.

Treichler et al., "A new approach to multi path correction of constant modulus signals," IEEE Transactions on Acoustics, Speech and Signal Processing, Apr. 1983, pp. 459-472, vol. 31, Issue 2, IEEE, New York, NY, USA.

Wu et al., "Robust Switching Blind Equalizer for Wireless Cognitive Receivers," IEEE Transactions on Wireless Communications, May 2008, pp. 1461-1465, vol. 7, No. 5, IEEE, New York, NY, USA.

Wu et al., "Robust Automatic Modulation Classification Using Cumulant Features in the Presence of Fading Channels" IEEE WCNC, Apr. 2006, pp. 2094-2099, vol. 4, IEEE, New York, NY, USA.

Polson, "Cognitive Radio Applications in Software Defined Radio," Software Defined Radio Technical Conference and Product Exposition, 2004. [Month of publication is unknown. The year of publication is sufficiently earlier than the effective U.S. filing date and any foreign priority date so the particular month of publication is not in issue.] [City/country of publication is unknown.].

Ramkumar et al., "Combined Blind Equalization and Automatic Modulation Classification for Cognitive Radios Under MIMO Environment," Software Defined Radio Technical Conference and Product Exposition, Oct. 2008. [City/country of publication is unknown.].

Technology Search Results, Virginia Tech Intellectual Properties, Copyright 1997-2012, VTIP, Inc., Retrieved Jan. 13, 2012 from http://www.vtip.org/availableTech/search.php?category=143255.

News and Notes for Our Industrial Partners, May 2008, Virginia Tech, Virginia, USA, found at http://wireless.vt.edu/affiliates/newsletters/may_08.pdf.

Hakala, "A 2.14-GHz Chireix Outphasing Transmitter" Microwave Theory and Techniques, IEEE Transactions on Microwave Theory and Techniques, Jun. 2005, pp. 2129-2138, vol. 53, No. 6, IEEE, New York, NY, USA.

Godard, "Self-Recovering Equalization and Carrier Tracking in Two-Dimensional Data Communication Systems," IEEE Transactions on Communications, Nov. 1980, pp. 1867-1875, vol. 28, Issue 11, IEEE, New York, NY, USA.

* cited by examiner

EFFICIENT OUTPHASING TRANSMITTER

BACKGROUND

The present disclosure is related to efficient outphasing transmitters and, more particularly, to efficient operation of outphasing transmitters to produce an output signal from a digital input signal.

BRIEF DESCRIPTION OF THE DRAWINGS

The foregoing and other features of the present disclosure will become more fully apparent from the following description and appended claims, taken in conjunction with the accompanying drawings. Understanding that these drawings depict only several embodiments in accordance with the disclosure and are, therefore, not to be considered limiting of its scope, the disclosure will be described with additional specificity and detail through use of the accompanying drawings.

In the drawings.

DETAILED DESCRIPTION

Figure 1:
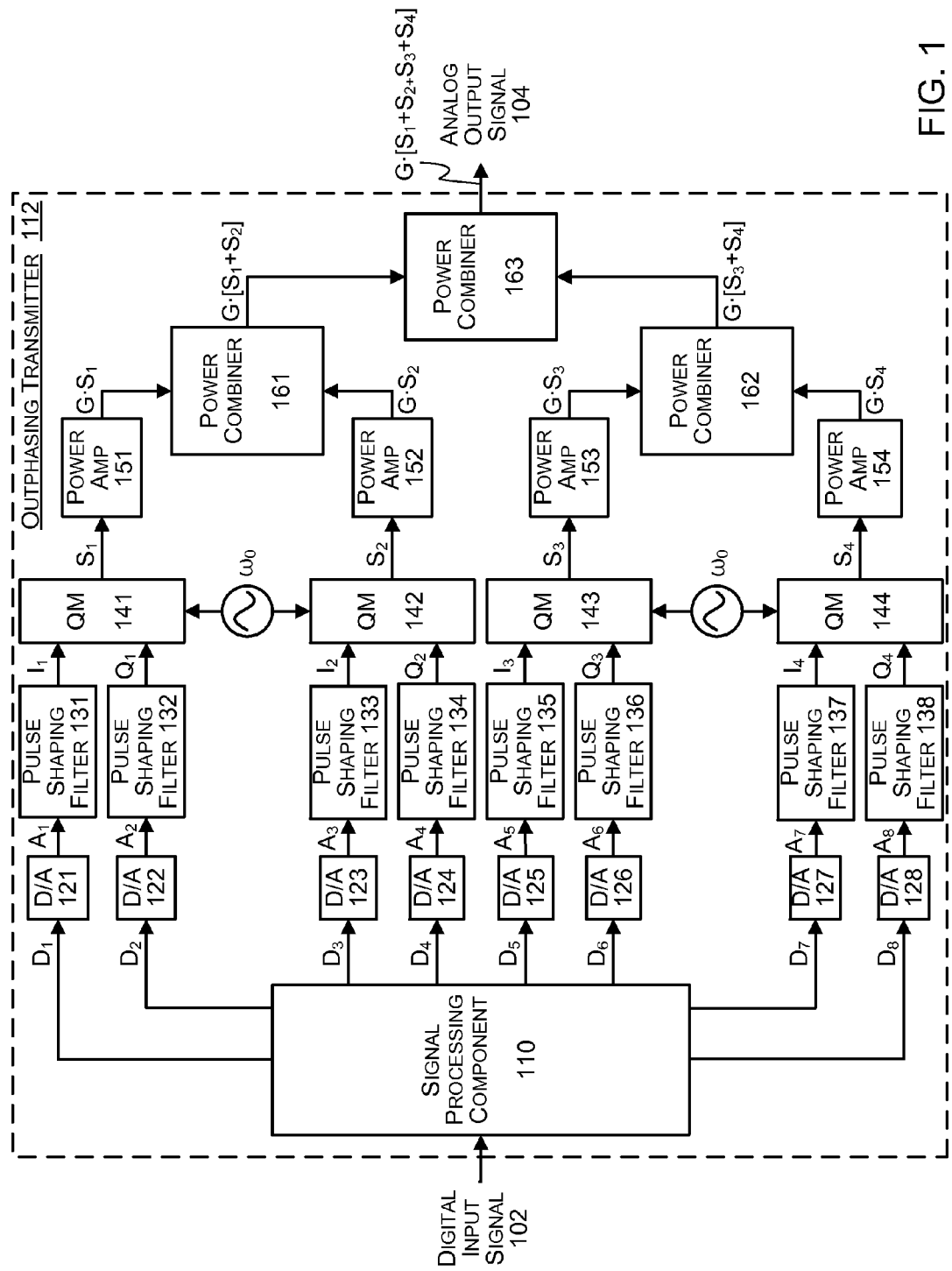
FIG. 1 is a block diagram illustrating an example efficient outphasing transmitter.

In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented here. It will be readily understood that the aspects of the present disclosure, as generally described herein, and illustrated in the Figures, may be arranged, substituted, combined, and designed in a wide variety of different configurations, all of which are explicitly contemplated and make part of this disclosure.

This disclosure is drawn, inter alia, to methods, systems, devices, and/or apparatus related to efficient outphasing transmitters and, more particularly, to efficient operation of outphasing transmitters to produce an output signal from a digital input signal.

The present disclosure contemplates that an outphasing transmitter structure may decompose an input signal into two constant magnitude (CM) signals with an amplitude-phase converter. The two CM signals may go through two identical branches that may include filters, up-converters, and a power amplifier (PA), and may then be recombined into an amplified signal. The outphasing transmitter may provide a simple method to support a wide variety of input signals with both high linearity and efficiency.

The system efficiency of the outphasing transmitter may be constrained by the efficiency of a power combiner at an output stage. Many have attempted to improve such efficiency through both signal processing and circuit design approaches. Some attempts have proposed an efficiency improvement approach through rectifying the signal and recouping the energy normally dissipated on the combiner due to out of phase signal components. Instead of a CM signal, some have suggested a multi-level scaling LINC scheme (MLINC) to increase the power combiner efficiency by shrinking the outphase angle to a smaller range. Some have proposed an efficiency improvement approach with reducing phase angle variation for adjacent symbols. Circuit design approaches may be focused on improving the isolation of two branches, adaptively adjusting the biasing voltage supply for power amplifiers before the combiner and reducing power consumption on the combiner by designing a matched load. Some have proposed adding a shunt susceptance for each branch at the output stage. In this approach, system efficiency may be improved by determining an optimal shunt susceptance value in a digital signal processing (DSP) domain.

The present disclosure also contemplates that current efficiency improvement approaches may have limitations. Regarding the circuit design approach, it may be difficult to adjust the shunt susceptance for input signals having different probability density functions (PDFs) once a system has been manufactured. Additionally, many signal processing approaches for such purpose are typically complex for implementation. MLINC may need adjustment of the scaling factors according to the instantaneous signal amplitude, and the outphasing angle depends on the PDF of the input signal and the number of scaling levels. To achieve better efficiency improvement, more levels may be needed, which in turn will increase the complexity. A selective mapping (SLM) approach may be used to reduce the peak-to-average power ratio (PAPR) of a multi-carrier signal. SLM selects one particular signal with the lowest PAPR ratio out of N signals representing the same information and may transmit that signal to a receiver. When SLM is used for an orthogonal frequency-division multiplexing (OFDM) signal, it has to determine an optimal configuration for a particular input signal and transmit the mapping information to a receiver for signal restoration at the receiver.

The present disclosure further contemplates that, in an outphasing transmitter, the input signal may be decomposed into two CM signals with an amplitude-to-phase converter as follows:

$$s = \alpha(t)e^{-j(\omega_0 t + \varphi(t))} = s_1 + s_2 = \frac{V_{ref}}{2}(e^{j\theta(t)} + e^{-j\theta(t)})e^{-j(\omega_0 t + \varphi(t))}, \quad \text{(Eq. 1)}$$

where $\theta(t)=\cos^{-1}(\alpha(t)/V_{ref})$. The reference voltage ($V_{ref}$) may be the maximum input signal magnitude. The two CM signals, $s_1$ and $s_2$, may go through two branches, and may be amplified by the power amplifier individually. Then the two amplified signals may be combined with a power combiner.

FIG. 1 is a block diagram illustrating an illustrating an example efficient outphasing transmitter arranged in accordance with at least some embodiments of the present disclosure. An example outphasing transmitter 112 may produce an analog output signal 104 based, at least in part, on a digital input signal 102. In an example embodiment, an outphasing transmitter 112 may include a signal processing component 110, a plurality of digital-to-analog converters 121, 122, 123, 124, 125, 126, 127, 128, a plurality of pulse shaping filters 131, 132, 133, 134, 135, 136, 137, 138, a plurality of quadrature modulators (QMs) 141, 142, 143, 144, a plurality of power amplifiers 151, 152, 153, 154 and a plurality of power combiners 161, 162, 163.

As depicted in FIG. 1, the signal processing component 110 may be adapted to produce a first constant modulation (CM) signal (depicted as signals $D_1$ and $D_2$), a second constant modulation (CM) signal (depicted as signals $D_3$ and $D_4$), a third constant modulation (CM) signal (depicted as signals $D_5$ and $D_6$) and a fourth constant modulation (CM) signal (depicted as signals $D_7$ and $D_8$) from the digital input signal 116. In an example embodiment, signals $D_1$, $D_3$, $D_5$ and $D_7$ may be in-phase components of the first CM signal, the second CM signal, the third CM signal and the fourth CM signal, respectively. In an example embodiment, signals $D_2$, $D_4$, $D_6$ and $D_8$ may be quadrature components of the first CM signal, the second CM signal, the third CM signal and the fourth CM signal, respectively.

The digital-to-analog converters 121, 122, 123, 124, 125, 126, 127, 128 may be adapted to convert a respective one of the first CM signal (depicted as signals $D_1$ and $D_2$), the second CM signal (depicted as signals $D_3$ and $D_4$), the third CM signal (depicted as signals $D_5$ and $D_6$) and the fourth CM signal (depicted as signals $D_7$ and $D_8$) from a digital state to an analog state. Digital signal $D_1$ may be converted to an analog signal $A_1$ by digital-to-analog converter 121, digital signal $D_2$ may be converted to an analog signal $A_2$ by digital-to-analog converter 122, digital signal $D_3$ may be converted to an analog signal $A_3$ by digital-to-analog converter 123, digital signal $D_4$ may be converted to an analog signal $A_4$ by digital-to-analog converter 124, digital signal $D_5$ may be converted to an analog signal $A_5$ by digital-to-analog converter 125, digital signal $D_6$ may be converted to an analog signal $A_6$ by digital-to-analog converter 126, digital signal $D_7$ may be converted to an analog signal $A_7$ by digital-to-analog converter 127, and digital signal $D_8$ may be converted to an analog signal $A_8$ by digital-to-analog converter 128.

The pulse shaping filters 131, 132, 133, 134, 135, 136, 137, 138 may be adapted to filter a respective one of the first CM signal (depicted as signals $A_1$ and $A_2$), the second CM signal (depicted as signals $A_3$ and $A_4$), the third CM signal (depicted as signals $A_5$ and $A_6$) and the fourth CM signal (depicted as signals $A_7$ and $A_8$). The pulse shaping filters 131, 132, 133, 134, 135, 136, 137, 138 may be configured to filter an analog signal to an in-phase signal or a quadrature signal. The pulse shaping filters 131, 132, 133, 134, 135, 136, 137, 138 may be configured to produce a respective complex signal, where each complex signal includes an in-phase component and a quadrature component. The present disclosure contemplates that an in-phase component and a quadrature component may be out of phase (relative to each other) by 90 degrees. An in-phase component and quadrature component may be represented as a complex signal. For example, signals $A_1$ and $A_2$ represent a complex signal $S_1$, where $S_1 = A_1 + A_2$. In one example, $S_1$ may be represented by $e^{j\theta} = \cos\theta + j\sin\theta$, where $A_1$ may have a cosine function of theta and $A_2$ may have a sine function of theta. In one example, $A_1$ and $A_2$ may be represented by $$A_1 = \frac{1}{2} V_{ref} \cos\theta(t)$$

and $$A_2 = \frac{1}{2} V_{ref} \sin\theta(t),$$

respectively. In an example embodiment, the first, second, third and fourth CM signals may have different shifting angles. In such an embodiment, each of the first, second, third and fourth CM signals may have the same expression, but with different shifting angles.

In one example, an analog signal $A_1$ may be filtered by pulse shaping filter 131 to produce an in-phase signal $I_1$ and analog signal $A_2$ may be filtered by pulse shaping filter 132 to produce a quadrature signal $Q_1$. Analog signal $A_3$ may be filtered by pulse shaping filter 133 to produce an in-phase signal $I_2$ and analog signal $A_4$ may be filtered by pulse shaping filter 134 to produce a quadrature signal $Q_2$. Analog signal $A_5$ may be filtered by pulse shaping filter 135 to produce an in-phase signal $I_3$ and analog signal $A_6$ may be filtered by pulse shaping filter 136 to produce a quadrature signal $Q_3$. Analog signal $A_7$ may be filtered by pulse shaping filter 137 to produce an in-phase signal $I_4$ and analog signal $A_8$ may be filtered by pulse shaping filter 138 to produce a quadrature signal $Q_4$. One goal of pulse shaping may be to reduce the requirement of RF frontend, inter-symbol-interference and the like. In one example, a pulse shaping filter may convert a square pulse to some pulse form with slow roll-off edges instead of sharp edges. In some examples, a window function may be used to represent a pulse shaping filter. For example, $I_1$ may be represented as $I_1 = W(f) \times A1(f)$ in frequency domain. A Root-Raising-Cosine (RRC) function (which may be used as the windowing function) may be represented as $$W(t) = \mathrm{sinc}\left(\frac{t}{T}\right) \frac{\cos(\pi \beta t / T)}{1 - (4\beta^2 t^2 / T^2)}$$

in a time domain, where T may represent a sample time interval, $\beta$ may represent a roll-off factor controlling the pulse shape. In an example embodiment, RRC filters at a transmitter and a receiver may provide a match filter condition according to Nyquist ISI criterion.

The QMs 141, 142, 143 and 144 may be adapted to modulate a respective one of the first CM signal (depicted as signals $I_1$ and $Q_1$), the second CM signal (depicted as signals $I_2$ and $Q_2$), the third CM signal (depicted as signals $I_3$ and $Q_3$) and the fourth CM signal (depicted as signals $I_4$ and $Q_4$) to produce a first modulated signal $S_1$, a second modulated signal $S_2$, a third modulated signal $S_3$ and a fourth modulated signal $S_4$, respectively. In an example embodiment, QMs 141, 142, 143 and 144 may be adapted to modulate the amplitudes of the in-phase and quadrature signals using an amplitude modulation (AM) analog modulation technique. Each QM 141, 142, 143 and 144 may sum the in-phase and quadrature signals, and the resulting modulated signal may be a combination of phase modulation (PM) and amplitude modulation. In an example embodiment, QM 141 may produce first modulated signal $S_1$ from in-phase signal $I_1$ and quadrature signal $Q_1$. QM 142 may produce second modulated signal $S_2$ from in-phase signal $I_2$ and quadrature signal $Q_2$. QM 143 may produce third modulated signal $S_3$ from in-phase signal $I_3$ and quadrature signal $Q_3$. QM 144 may produce fourth modulated signal $S_4$ from in-phase signal $I_4$ and quadrature signal $Q_4$. One function of quadrature modulation may be represented as $S_1 = I_1 \cos\omega_0 t + Q_1 \sin\omega_0 t$.

The power amplifiers 151, 152, 153, and 154 may be adapted to amplify a respective one of the first modulated signal (depicted as signal $S_1$), the second modulated signal (depicted as signal $S_2$), the third modulated signal (depicted as signal $S_3$), and the fourth modulated signal (depicted as signal $S_4$). Power amplifiers may amplify a signal by a gain (G) value. In an example embodiment, power amplifier 151 may amplify first modulated signal $S_1$ by a gain value G to produce an amplified signal $G \cdot S_1$. Similarly, power amplifier 152 may amplify second modulated signal $S_2$ by a gain value G to produce an amplified signal $G \cdot S_2$, power amplifier 153 may amplify third modulated signal $S_3$ by a gain value G to produce an amplified signal $G \cdot S_3$, and power amplifier 154 may amplify fourth modulated signal $S_4$ by a gain value G to produce an amplified signal $G \cdot S_4$.

In one example, power amplifiers 151, 152, 153 and/or 154 may be non-linear power amplifiers, such as Class-F PA. Gain value G may be determined by a power ratio between the output power and input power $$\left(G = \frac{P_{out}}{P_{in}}\right).$$

The value of G may vary based upon goals of an embodiment. In one example, power amplifiers 151, 152, 153 and/or 154 may be designed using a circuit design approach. Among other factors, choices of transistors, supply voltages, matching networks and power amplifier structures may impact the value of G. The amplitude of G may be a constant for passband. The phase shift of G may be a linear phase shift for pass-band. In such an example, supply voltage may be used to control G according to a phase shift (generated by signal processing component 110) in a DSP domain.

The power combiner 161 may be adapted to receive and combine the first modulated signal (depicted as signal $G \cdot S_1$) and the second modulated signal (depicted as signal $G \cdot S_2$) to produce a first combined signal $G(S_1+S_2)$. Similarly, the power combiner 162 may be adapted to receive and combine the third modulated signal (depicted as signal $G \cdot S_3$) and the fourth modulated signal (depicted as signal $G \cdot S_4$) to produce a second combined signal $G(S_3+S_4)$. The power combiner 163 may be adapted to receive and combine the first combined signal $G(S_1+S_2)$ and the second combined signal $G(S_3+S_4)$ to produce the output signal $G(S_1+S_2+S_3+S_4)$ 104.

In some examples, the signal processing component 110 may include a digital signal processing component, a phase shifter component and/or a selective mapping component. In some examples, an optimal phase shift associated with the phase shifter component may correlate to improved efficiency of the outphasing transmitter 112. In some embodiments, the signal processing component 110 may process the digital input signal 102 using a digital signal processing technique, a phase shifter technique and/or a selective mapping technique. The phase shifter may correlate to the supply voltage of QMs 141, 142, 143, and 144 (among other components) to increase the efficiency of transmitter 112.

The present disclosure contemplates that the efficiency $\eta$ of an outphasing transmitter system may be defined as $$\eta = \eta_a \eta_c \quad \text{(Eq. 2)}$$

where $\eta_a$ may be the efficiency of the power amplifier, $\eta_c$ may be the efficiency of the combiner (which may include the efficiency for the combiner due to insertion loss and the efficiency due to the signal recombining process). A nonlinear power amplifier may be used, since two CM signals may relax the linearity goals of the power amplifier. Thus, the system efficiency may be mostly determined by the efficiency of the combiner. At the output stage, the impedance of the power amplifier may be represented as $$Z_s = \frac{e^{j\theta}}{(e^{j\theta} + e^{-j\theta})/Z_L} = \frac{Z_L}{2}(1 + j\tan(\theta)) \quad \text{(Eq. 3)}$$

where $Z_L$ is the load resistance.

The effective RF load seen by the PA may be a resistive component that is equal to half the load resistance with an additional series inductive reactance, $X = Z_L \tan(\theta)/2$, which may be a function of the phase modulation angle $\theta$. In other words, the phase difference between the two branches may cause a reactive component at the device load. The real part of the output power at the combiner may be radiated through an antenna, while the virtual power may be dissipated on power amplifier load resistance.

One potential method of improving the combiner efficiency may be to reduce the power dissipated in the reactance components. In circuit design methods, a matched load may be used to achieve this goal. For example, inductors and capacitors may be added to the load to reduce the reactance components of the combiner, or a parallel admittance may be added at the output stage, which may change the value of the complex load and may improve the combiner's efficiency with an optimal shunt susceptance B. Since the complex load $Z_s(\theta)$ is a function of angle $\theta$, or the amplitude of input signal s, the circuit design method may only achieve an optimal average efficiency for a particular input signal, thereby lacking flexibility, and making it difficult to control drifting and aging problems. Further, the circuit design approach may not solve nonlinearity effects due to the mismatch of phase and gain between the two branches.

In some example embodiments, two CM signals may be reconstructed as $$\begin{cases} s_1 = \frac{1}{2}V_{ref}e^{j\theta(t)} & \theta(t) \leq \varphi_0 \\ s_1 = \frac{1}{2}V_{ref}K(1-jB)e^{j\theta(t)} & \theta(t) > \varphi_0 \end{cases} \quad \text{(Eq. 4)}$$

and $$\begin{cases} s_2 = \frac{1}{2}V_{ref}e^{-j\theta(t)} & \theta(t) \leq \varphi_0 \\ s_2 = \frac{1}{2}V_{ref}K(1+jB)e^{-j\theta(t)} & \theta(t) > \varphi_0, \end{cases}$$

where $V_{ref}$ may be a maximum amplitude of the digital input signal, $\theta$ may be a phase modulation angle, t may be a time, B may be a shunt susceptance, K may be defined by the equation $$K = \frac{1}{\sqrt{1+B^2}}$$

and $\phi_0$ may be defined by the equation $$\varphi_0 = \cos^{-1}\frac{1}{\sqrt{1+B^2}}.$$

Such signals may include baseband representation at the signal processing component before they are amplified with a power amplifier. In the above, B may be an equivalent shunt susceptance to reduce the virtual power on the combiner. The normalized signal amplitude at the output of the combiner may be expressed as $$s' = s_1 + s_2 = e^{j\theta} + e^{-j\theta} = 2\cos\theta \quad \theta(t) \leq \phi_0 \text{ and}$$

$$s' = s_1 + s_2 = K(1-jB)e^{j\theta(t)} + (1+jB)e^{-j\theta} = 2K(\cos\theta + B\sin\theta)$$
$$\theta(t) > \phi_0. \quad \text{(Eq. 5)}$$

The complex load for the upper branch when $\theta > \phi_0$ may be $$Z_s = \frac{e^{j\theta}(1-jB)}{2\cos\theta + 2B\sin\theta} = \frac{1}{2} + \frac{j(\sin\theta - B\cos\theta)}{2\cos\theta + 2B\sin\theta} \quad \text{(Eq. 6)}$$

The instantaneous combiner efficiency for both signals may be $$\eta(\theta) = \frac{\cos\theta + B\sin\theta}{\sqrt{1+B^2}}, \text{ for } \theta > \varphi_0; \text{ or } \frac{1}{\sqrt{1+\tan^2\theta}}, \quad \text{(Eq. 7)}$$

for $\theta \leq \varphi_0$

Equation 7 may indicate that the value of B may be changed to optimize the instantaneous efficiency of the combiner. Note that Equations 4 and 5 may be nonlinearity selective mappings which may reduce the PAPR of the input signal. Such mapping may introduce out-band emission since the output of the combiner is not cos θ, but cos θ+B sin θ. This may be overcome by changing a conventional outphasing transmitter structure to the outphasing transmitter structure, as depicted in FIG. 1.

As depicted in FIG. 1, there may be two outphasing channels with a total of four branches. The input signal for the lower channel may be expressed as $$\begin{cases} s_3 = \frac{1}{2}V_{ref}e^{j\theta(t)} & \theta(t) \leq \varphi_0 \\ s_3 = \frac{1}{2}V_{ref}K(1+jB)e^{j\theta(t)} & \theta(t) > \varphi_0 \end{cases} \quad \text{(Eq. 8)}$$

and $$\begin{cases} s_4 = \frac{1}{2}V_{ref}e^{-j\theta(t)} & \theta(t) \leq \varphi_0 \\ s_4 = \frac{1}{2}V_{ref}K(1-jB)e^{-j\theta(t)} & \theta(t) > \varphi_0, \end{cases}$$

where $V_{ref}$ may be a maximum amplitude of the digital input signal, θ may be a phase modulation angle, t may be a time, B may be a shunt susceptance, K may be defined by the equation $$K = \frac{1}{\sqrt{1+B^2}}$$

and $\phi_0$ may be defined by the equation $$\varphi_0 = \cos^{-1}\frac{1}{\sqrt{1+B^2}}.$$

The average efficiency of power combiner 161 and power combiner 162 for the two channels may be improved with an optimal value of B. Power combiner 163 may restore the signal and maintain the integrity of the transmitted signal. In some embodiments, power combiner 163 may be implemented with lattice-type LC balun with impendence transformation whose actual efficiency may reach 80-90% with 0.5 dB to 1 dB insertion loss. The improvement of the average system efficiency may be determined mostly by the efficiencies of the three power combiners 161, 162, 163. The lower channel may have exactly the same signal format if the sign of B is changed in Equation 4. Thus, one may examine the efficiency improvement for one of the two channels. The other channel may be verified in a similar way.

For each of the two channels, in addition to the combiner efficiency, the adjacent channel power ratio (ACPR) and error vector magnitude (EVM) due to gain/phase mismatch may also be improved dramatically due to PAPR reduction.

The average combiner efficiency may be defined as $$\eta(B)_{average} = \int_0^{\frac{\pi}{2}} \frac{Re(Z_s(\theta))}{\|Z_s(\theta)\|} f(\theta)\,d\theta. \quad \text{(Eq. 9)}$$

The average efficiency relates to the PDF of θ, f(θ).

An optimal value of B may be determined to achieve the improved system efficiency for signals having different PDFs. For example, when the PDF of envelope x is Rayleigh distribution, $$f_x(x) = \frac{x}{\sigma^2}e^{\frac{-x^2}{2\sigma^2}}$$

$x \in [0, \infty).$

If the envelope is normalized by $V_{ref}$, $x \in [0, \infty)$, the PDF of the corresponding θ is $$f_\Theta(\theta) = \frac{\sin 2\theta}{2\sigma^2}e^{\frac{-\cos^2\theta}{2\sigma^2}} \quad \text{(Eq. 10)}$$

The average efficiency of the combiner may be derived as $$\eta(B)_{average} = \frac{1}{\sqrt{1+B^2}} \times \text{term1} + \frac{B}{\sqrt{1+B^2}} \times \text{term2}, \quad \text{(Eq. 11)}$$

where term1 and term2 are the values at input terminals 1 and 2 of the combiner, respectively.

The maximum average efficiency $\eta(B)_{max}$ for the combiner may be defined as $$\eta(B)_{max} = \sqrt{a^2+b^2}, \text{ when } B = \frac{b}{a}, \quad \text{(Eq. 12)}$$

where a is defined by the equation $$a = -\exp\frac{-1}{2\sigma^2} - term1$$

and b is defined by the equation b=1−term2, where σ is a variance and where term1 and term2 are the values at input terminals 1 and 2 of the combiner, respectively.

Once the PDF of the input signal is known, an optimal B may be defined with Equation 12. For example, for a Rayleigh distributed input signal with variance σ=0.0176, an optimal B and maximum average combiner efficiency may be calculated according to Equation 12. An optimal B may boost the average combiner efficiency more than 400% compared with a case where B=0.

One potential issue for the implementation of the outphasing transmitter may be gain and phase imbalance/mismatch between the two branches, which may degrade the error vector magnitude (EVM) and adjacent channel power ratio (ACPR) performance. EVM may be defined as the square mean distance in the I-Q plane, between transmission constellation and the ideal constellation. ACPR may be indicative of the adjacent channel interference.

If the gain and phase imbalances may be defined as $\Delta G/G$ and $\Delta\theta$, the ACPR and EVM may be expressed as $$ACPR = \kappa(\zeta-1)\left[\frac{\Delta G^2}{2G} + \frac{\Delta\theta^2}{2}\right] \text{ and } EVM = (\zeta-1)\left[\frac{\Delta G^2}{2G} + \frac{\Delta\theta^2}{2}\right],$$

$$\text{where } \kappa = \int_{fc+5\Delta f-BW/2}^{fc+\Delta f+BW/2} E(f)df / \langle|\sin\theta|^2\rangle$$

and E(f): PSD of j sin $\theta'$ where $\theta'=\theta-\phi_0$ and $\xi=V_{ref}^2/\langle|s_{in}|^2\rangle$.

The above equations show that mismatch performance may be improved if the value of $\xi$ is reduced. Since the maximum amplitude of the input signal may be expressed as $V_{ref}$ the variable $\xi$ may be the PAPR of the input signal. In other words, the mismatch performance may be improved if the PAPR is decreased. Since the PAPR may be reduced using selective mapping, each of the channels in FIG. 1 may have better mismatch performance than a conventional outphasing transmitter.

Figure 2:
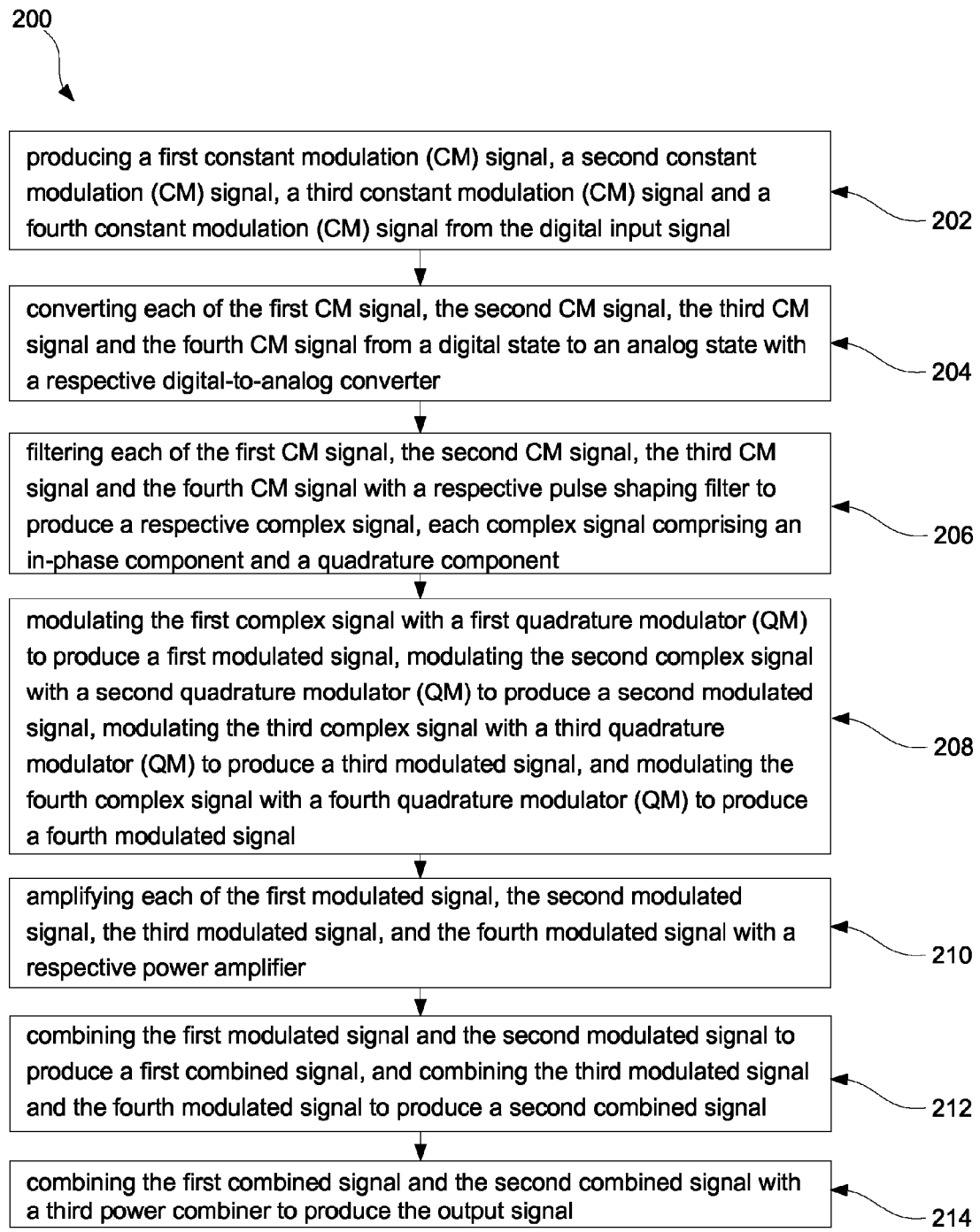
FIG. 2 is a flowchart depicting an example method for an outphasing transmitter to produce an output signal.

FIG. 2 is a flowchart depicting an example method 200 for an outphasing transmitter to produce an output signal generated, at least in part, from a digital input signal, that is arranged in accordance with at least some embodiments of the present disclosure. Example methods 200 may include one or more of processing operations 202, 204, 206, 208, 210, 212 and/or 214.

Processing may begin at operation 202, which may include producing a first, second, third and/or fourth constant modulation (CM) signal from the digital input signal. Processing may flow from operation 202 to operation 204. Operation 204 may include converting each of the first, second, third, and/or fourth CM signal from a digital state to an analog state using a respective digital-to-analog converter. Operation 206 may provide filtering each of the first, second, third, and/or fourth CM signal with a respective pulse shaping filter. The filtering of operation 206 may produce a complex signal (a first, second, third and/or fourth complex signal) for the respective first, second, third and/or fourth CM signals, where each complex signal may include an in-phase component and a quadrature component.

Processing may then continue from operation 206 to operation 208, which may include modulating the first, second, third, and/or fourth complex signals with quadrature modulators (QMs) to produce a first, second, third and/or fourth modulated signal. At operation 210, the first and second, third and/or fourth modulated signals may be amplified with a respective power amplifier. Operation 212 may include combining the first modulated signal and the second modulated signal to produce a first combined signal, and combining the third modulated signal and the fourth modulated signal to produce a second combined signal. Processing may continue to operation 214, which may include combining the first combined signal and the second combined signal with a third power combiner to produce the output signal.

In some embodiments, the output signal may be transmitted to an antenna for subsequent transmission.

In some embodiments, the first CM signal may be defined by the equation $$\begin{cases} s_1 = \frac{1}{2}V_{ref}e^{j\theta(t)} & \theta(t) \leq \varphi_0 \\ s_1 = \frac{1}{2}V_{ref}K(1-jB)e^{j\theta(t)} & \theta(t) > \varphi_0, \end{cases}$$

where $V_{ref}$ may be a maximum amplitude of the digital input signal, $\theta$ may be a phase modulation angle, t may be a time, B may be a shunt susceptance, K may be defined by the equation $$K = \frac{1}{\sqrt{1+B^2}}$$

and $\phi_0$ may be defined by the equation $$\varphi_0 = \cos^{-1}\frac{1}{\sqrt{1+B^2}}.$$

In some embodiments, the second CM signal may be defined by the equation $$\begin{cases} s_2 = \frac{1}{2}V_{ref}e^{j\theta(t)} & \theta(t) \leq \varphi_0 \\ s_2 = \frac{1}{2}V_{ref}K(1+jB)e^{j\theta(t)} & \theta(t) > \varphi_0, \end{cases}$$

where $V_{ref}$ may be a maximum amplitude of the digital input signal, $\theta$ may be a phase modulation angle, t may be a time, B may be a shunt susceptance, K may be defined by the equation $$K = \frac{1}{\sqrt{1+B^2}}$$

and $\phi_0$ may be defined by the equation $$\varphi_0 = \cos^{-1}\frac{1}{\sqrt{1+B^2}}.$$

In some embodiments, the third CM signal may be defined by the equation $$\begin{cases} s_3 = \frac{1}{2}V_{ref}e^{j\theta(t)} & \theta(t) \leq \varphi_0 \\ s_3 = \frac{1}{2}V_{ref}K(1+jB)e^{j\theta(t)} & \theta(t) > \varphi_0, \end{cases}$$

where $V_{ref}$ may be a maximum amplitude of the digital input signal, $\theta$ may be a phase modulation angle, t may be a time, B may be a shunt susceptance, K may be defined by the equation $$K = \frac{1}{\sqrt{1+B^2}}$$

and $\phi_0$ may be defined by the equation $$\varphi_0 = \cos^{-1}\frac{1}{\sqrt{1+B^2}}.$$

Further, some embodiments may provide that the fourth CM signal may be defined by the equation $$\begin{cases} s_4 = \frac{1}{2} V_{ref} e^{j\theta(t)} & \theta(t) \leq \varphi_0 \\ s_4 = \frac{1}{2} V_{ref} K(1 + jB) e^{j\theta(t)} & \theta(t) > \varphi_0, \end{cases}$$

where $V_{ref}$ may be a maximum amplitude of the digital input signal, $\theta$ may be a phase modulation angle, t may be a time, B may be a shunt susceptance, K may be defined by the equation $$K = \frac{1}{\sqrt{1+B^2}}$$

and $\phi_0$ may be defined by the equation $$\varphi_0 = \cos^{-1} \frac{1}{\sqrt{1+B^2}}.$$

Some embodiments may provide for calculating a shunt susceptance B to increase efficiency of the first power combiner, the second power combiner and/or the third power combiner. Shunt susceptance B may be defined by the equation $$B = \frac{b}{a},$$

where a may be defined by the equation $$a = -\exp\frac{-1}{2\sigma^2} - \text{term1}$$

and b may be defined by the equation b=1−term2 for a Rayleigh distributed amplitude, and where term1 and term2 are the values at input terminals 1 and 2 of the combiner, respectively. $\sigma$ may be a parameter of a Rayleigh distribution. Further, some embodiments may provide for calculating a maximum average efficiency $\eta(B)_{max}$ for the first power combiner, the second power combiner and/or the third power combiner. Maximum average efficiency $\eta(B)_{max}$ may be defined by the equation $\eta(B)_{max} = \sqrt{a^2+b^2}$ for a Rayleigh distribution. One may desire to calculate many shunt susceptance B values to determine an improved combiner efficiency. A shunt susceptance B may be chosen based on an outphasing transmitter designer's efficiency goals, desires and/or nonlinearity requirements. A supply voltage of one or more power amplifiers may be altered and/or controlled based, at least in part, on the phase shifter and/or the shunt susceptance in the digital domain.

Figure 3A:
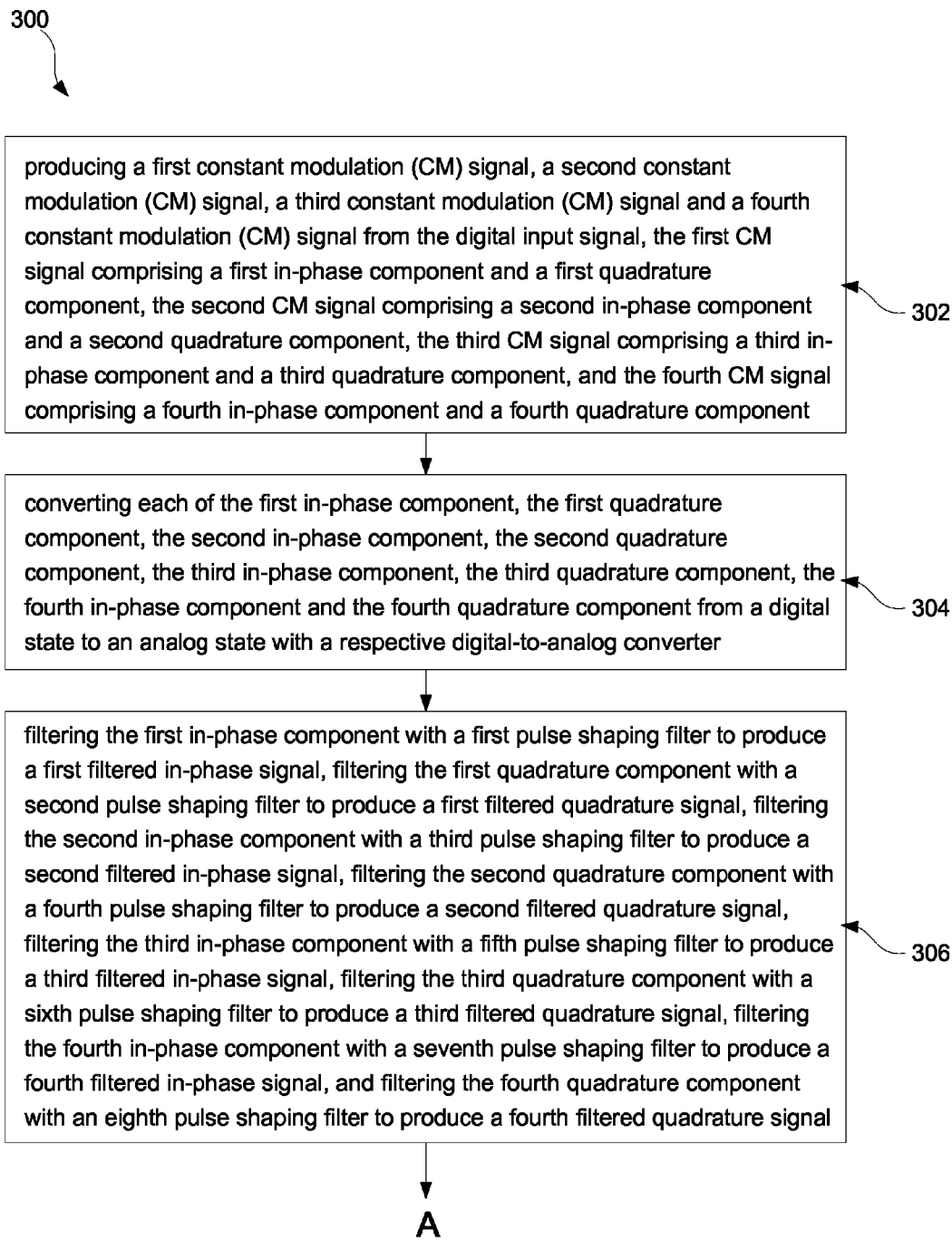
FIGS. 3A and 3B are a flowchart depicting an example method for an outphasing transmitter to produce an output signal.
Figure 3B:
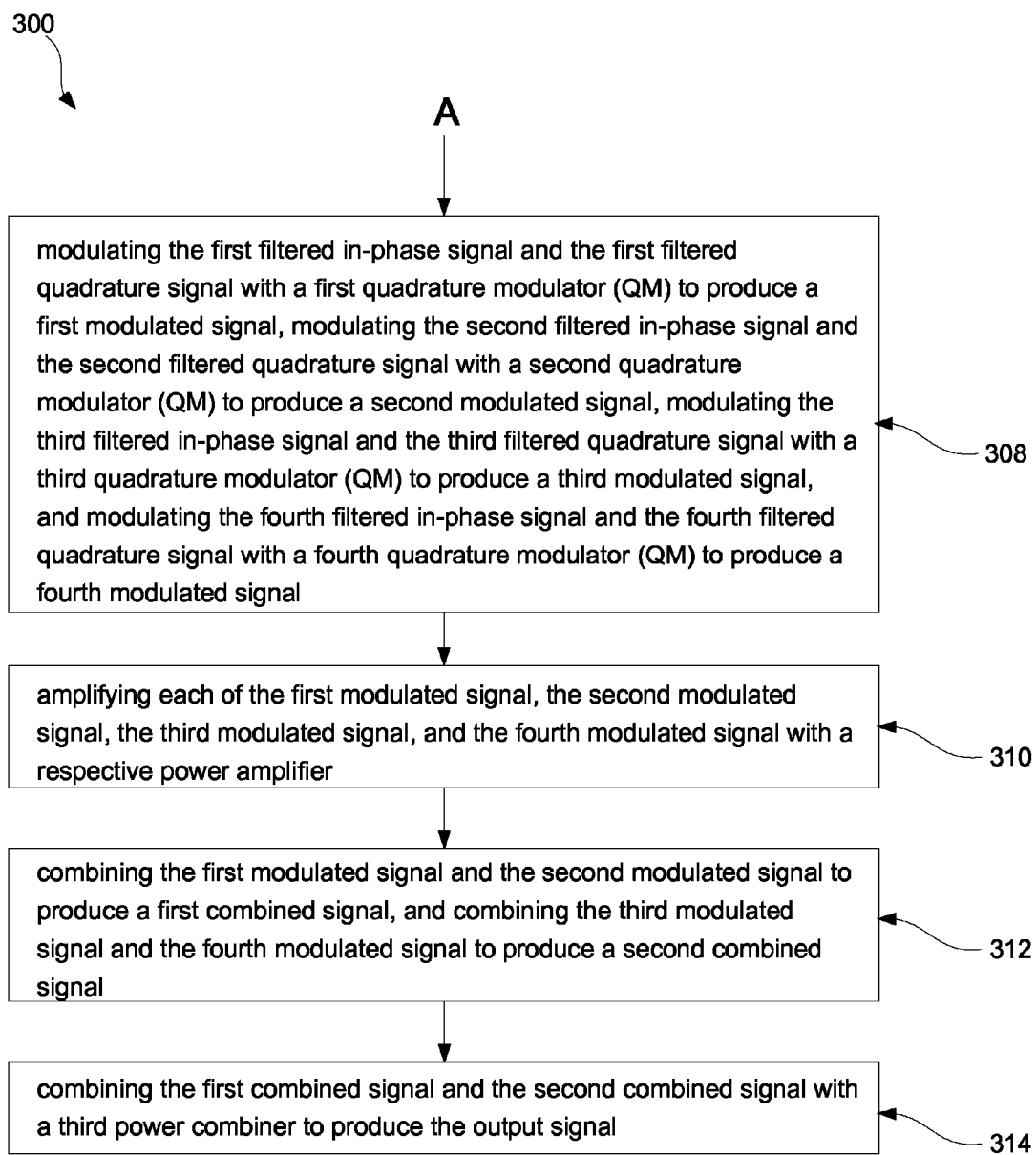

FIGS. 3A and 3B are a flowchart depicting an example method 300 for an outphasing transmitter to produce an output signal generated, at least in part, from a digital input signal, in accordance with at least some embodiments of the present disclosure. The example methods 300 may include one or more of processing operations 302, 304, 306, 308, 310, 312 and/or 314.

Processing for method 300 may begin at operation 302, which may include producing a first constant modulation (CM) signal, a second constant modulation (CM) signal, a third constant modulation (CM) signal and a fourth constant modulation (CM) signal from the digital input signal. In such an operation, the first CM signal may include a first in-phase component and a first quadrature component. Similarly, the second CM signal may include a second in-phase component and a second quadrature component, the third CM signal may include a third in-phase component and a third quadrature component, and/or the fourth CM signal may include a fourth in-phase component and a fourth quadrature component.

Processing may continue from operation 302 to operation 304, which may include converting each of the first in-phase component, the first quadrature component, the second in-phase component, the second quadrature component, the third in-phase component, the third quadrature component, the fourth in-phase component and/or the fourth quadrature component from a digital state to an analog state with a respective digital-to-analog converter.

Processing may then continue from operation 304 to operation 306, which may include filtering the first in-phase component with a first pulse shaping filter to produce a first filtered in-phase signal and filtering the first quadrature component with a second pulse shaping filter to produce a first filtered quadrature signal. Operation 306 may further include filtering the second in-phase component with a third pulse shaping filter to produce a second filtered in-phase signal, filtering the second quadrature component with a fourth pulse shaping filter to produce a second filtered quadrature signal, filtering the third in-phase component with a fifth pulse shaping filter to produce a third filtered in-phase signal, filtering the third quadrature component with a sixth pulse shaping filter to produce a third filtered quadrature signal, filtering the fourth in-phase component with a seventh pulse shaping filter to produce a fourth filtered in-phase signal, and filtering the fourth quadrature component with an eighth pulse shaping filter to produce a fourth filtered quadrature signal.

Continuing, operation 308 may include modulating the first filtered in-phase signal and the first filtered quadrature signal with a first quadrature modulator (QM) to produce a first modulated signal. Operation 308 may further include modulating the second filtered in-phase signal and the second filtered quadrature signal with a second QM to produce a second modulated signal, modulating the third filtered in-phase signal and the third filtered quadrature signal with a third QM to produce a third modulated signal, and/or modulating the fourth filtered in-phase signal and the fourth filtered quadrature signal with a fourth QM to produce a fourth modulated signal.

At operation 310, the first modulated signal, the second modulated signal, the third modulated signal and/or the fourth modulated signal may be amplified with a respective power amplifier.

Continuing to operation 312, the first modulated signal and the second modulated signal may be combined with a first power combiner to produce a first combined signal. Similarly, the third modulated signal and the fourth modulated signal may be combined with a second power combiner to produce a second combined signal.

At operation 314, the first combined signal and the second combined signal may be combined with a third power combiner to produce the output signal.

The herein described subject matter sometimes illustrates different components contained within, or coupled with, different other components. It is to be understood that such depicted architectures are merely examples, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected", or "operably coupled", to each other to achieve the desired functionality, and any two components capable of being so associated can also be viewed as being "operably couplable", to each other to achieve the desired functionality. Specific examples of operably couplable include but are not limited to physically mateable and/or physically interacting components and/or wirelessly interactable and/or wirelessly interacting components and/or logically interacting and/or logically interactable components.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to inventions containing only one such recitation, even when the same claim 1ncludes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations). Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.).

It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

While various aspects and embodiments have been disclosed herein, other aspects and embodiments will be apparent to those skilled in the art. The various aspects and embodiments disclosed herein are for purposes of illustration and are not intended to be limiting, the true scope and spirit being indicated by the following claims.

What is claimed is:

1. A method for an outphasing transmitter to produce an output signal generated, at least in part, from a digital input signal, the method for the outphasing transmitter comprising:
   producing a first constant modulation (CM) signal, a second constant modulation (CM) signal, a third constant modulation (CM) signal and a fourth constant modulation (CM) signal from the digital input signal;
   converting each of the first CM signal, the second CM signal, the third CM signal and the fourth CM signal from a digital state to an analog state with a respective digital-to-analog converter;
   filtering each of the first CM signal, the second CM signal, the third CM signal and the fourth CM signal with a respective pulse shaping filter and outputting a respective in-phase signal and a respective quadrature signal;
   modulating the first in-phase signal and the first quadrature signal with a first quadrature modulator (QM) to produce a first modulated signal, modulating the second in-phase signal and the second quadrature signal with a second quadrature modulator (QM) to produce a second modulated signal, modulating the third in-phase signal and the third quadrature signal with a third quadrature modulator (QM) to produce a third modulated signal, and modulating the fourth in-phase signal and the fourth quadrature signal with a fourth quadrature modulator (QM) to produce a fourth modulated signal;
   amplifying each of the first modulated signal, the second modulated signal, the third modulated signal, and the fourth modulated signal with a respective power amplifier;
   combining the first modulated signal and the second modulated signal with a first power combiner to produce a first combined signal, and combining the third modulated signal and the fourth modulated signal with a second power combiner to produce a second combined signal; and
   combining the first combined signal and the second combined signal with a third power combiner to produce the output signal.

2. The method of claim 1, further comprising:
   transmitting the output signal to at least one antenna.

3. The method of claim 1, wherein the first CM signal is defined by the equation $$s_1 = \frac{1}{2}V_{ref}e^{j\theta(t)} \qquad \theta(t) \leq \varphi_0$$

$$s_1 = \frac{1}{2}V_{ref}K(1-jB)e^{j\theta(t)} \quad \theta(t) > \varphi_0,$$

where $V_{ref}$ is a maximum amplitude of the digital input signal, θ is a phase modulation angle, t is a time, B is a shunt susceptance, K is defined by the equation $$K = \frac{1}{\sqrt{1+B^2}}$$

and $\phi_0$ is defined by the equation $$\varphi_0 = \cos^{-1}\frac{1}{\sqrt{1+B^2}}.$$

4. The method of claim 1, wherein the second CM signal is defined by the equation $$s_2 = \frac{1}{2}V_{ref}e^{-j\theta(t)} \qquad \theta(t) \le \varphi_0$$

$$s_2 = \frac{1}{2}V_{ref}K(1+jB)e^{-j\theta(t)} \quad \theta(t) > \varphi_0,$$

where $V_{ref}$ is a maximum amplitude of the digital input signal, θ is a phase modulation angle, t is a time, B is a shunt susceptance, K is defined by the equation $$K = \frac{1}{\sqrt{1+B^2}}$$

and $\phi_0$ is defined by the equation $$\varphi_0 = \cos^{-1}\frac{1}{\sqrt{1+B^2}}.$$

5. The method of claim 1, wherein the third CM signal is defined by the equation $$s_3 = \frac{1}{2}V_{ref}e^{j\theta(t)} \qquad \theta(t) \le \varphi_0$$

$$s_3 = \frac{1}{2}V_{ref}K(1+jB)e^{j\theta(t)} \quad \theta(t) > \varphi_0,$$

where $V_{ref}$ is a maximum amplitude of the digital input signal, θ is a phase modulation angle, t is a time, B is a shunt susceptance, K is defined by the equation $$K = \frac{1}{\sqrt{1+B^2}}$$

and $\phi_0$ is defined by the equation $$\varphi_0 = \cos^{-1}\frac{1}{\sqrt{1+B^2}}.$$

6. The method of claim 1, wherein the fourth CM signal is defined by the equation $$s_4 = \frac{1}{2}V_{ref}e^{-j\theta(t)} \qquad \theta(t) \le \varphi_0$$

$$s_4 = \frac{1}{2}V_{ref}K(1-jB)e^{-j\theta(t)} \quad \theta(t) > \varphi_0,$$

where $V_{ref}$ is a maximum amplitude of the digital input signal, θ is a phase modulation angle, t is a time, B is a shunt susceptance, K is defined by the equation $$K = \frac{1}{\sqrt{1+B^2}}$$

and $\phi_0$ is defined by the equation $$\varphi_0 = \cos^{-1}\frac{1}{\sqrt{1+B^2}}.$$

7. The method claim 1, further comprising:
calculating a shunt susceptance B to increase efficiency of at least one of the first power combiner, the second power combiner and the third power combiner; and
altering a supply voltage of at least one of the power amplifiers based, at least in part, on the shunt susceptance B in the digital domain.

8. The method of claim 7, wherein the shunt susceptance B is defined by the equation $$B = \frac{b}{a},$$

where a is defined by the equation $$a = -\exp\frac{-1}{2\sigma^2} - term1$$

where term1 is a value at a first input terminal of the at least one of the first power combiner, the second power combiner and the third power combiner, and b is defined by the equation b=1−term2, where σ is a Rayleigh distribution parameter, and where term2 is a value at a second input terminal of the at least one of the first power combiner, the second power combiner and the third power combiner.

9. The method of claim 1, further comprising:
calculating a maximum average efficiency $\eta(B)_{max}$ for at least one of the first power combiner, the second power combiner and the third power combiner.

10. The method of claim 9, wherein the maximum average efficiency $\eta(B)_{max}$ is defined by the equation $\eta(B)_{max} = \sqrt{a^2+b^2}$, where a shunt susceptance B is defined by the equation $$B = \frac{b}{a},$$

where a is defined by the equation $$a = -\exp\frac{-1}{2\sigma^2} - term1$$

where term1 is a value at a first input terminal of the at least one of the first power combiner, the second power combiner and the third power combiner, and b is defined by the equation b=1−term2, where σ is a Rayleigh distribution parameter, and where term2 is a value at a second input terminal of the at least one of the first power combiner, the second power combiner and the third power combiner.

11. The method of claim 10, further comprising:
calculating a plurality of shunt susceptance B values to determine an improved combiner efficiency.

12. A method for an outphasing transmitter to produce an output signal generated, at least in part, from a digital input signal, the method for the outphasing transmitter comprising:
producing a first constant modulation (CM) signal, a second constant modulation (CM) signal, a third constant modulation (CM) signal and a fourth constant modulation (CM) signal from the digital input signal, the first CM signal comprising a first in-phase component and a first quadrature component, the second CM signal comprising a second in-phase component and a second quadrature component, the third CM signal comprising a third in-phase component and a third quadrature component, and the fourth CM signal comprising a fourth in-phase component and a fourth quadrature component;
converting each of the first in-phase component, the first quadrature component, the second in-phase component, the second quadrature component, the third in-phase component, the third quadrature component, the fourth in-phase component and the fourth quadrature component from a digital state to an analog state with a respective digital-to-analog converter;
filtering the first in-phase component with a first pulse shaping filter to produce a first filtered in-phase signal, filtering the first quadrature component with a second pulse shaping filter to produce a first filtered quadrature signal, filtering the second in-phase component with a third pulse shaping filter to produce a second filtered in-phase signal, filtering the second quadrature component with a fourth pulse shaping filter to produce a second filtered quadrature signal, filtering the third in-phase component with a fifth pulse shaping filter to produce a third filtered in-phase signal, filtering the third quadrature component with a sixth pulse shaping filter to produce a third filtered quadrature signal, filtering the fourth in-phase component with a seventh pulse shaping filter to produce a fourth filtered in-phase signal, and filtering the fourth quadrature component with an eighth pulse shaping filter to produce a fourth filtered quadrature signal;
modulating the first filtered in-phase signal and the first filtered quadrature signal with a first quadrature modulator (QM) to produce a first modulated signal, modulating the second filtered in-phase signal and the second filtered quadrature signal with a second quadrature modulator (QM) to produce a second modulated signal, modulating the third filtered in-phase signal and the third filtered quadrature signal with a third quadrature modulator (QM) to produce a third modulated signal, and modulating the fourth filtered in-phase signal and the fourth filtered quadrature signal with a fourth quadrature modulator (QM) to produce a fourth modulated signal;
amplifying each of the first modulated signal, the second modulated signal, the third modulated signal, and the fourth modulated signal with a respective power amplifier;
combining the first modulated signal and the second modulated signal with a first power combiner to produce a first combined signal, and combining the third modulated signal and the fourth modulated signal with a second power combiner to produce a second combined signal; and
combining the first combined signal and the second combined signal with a third power combiner to produce the output signal.

13. The method of claim 12, wherein the first CM signal is defined by the equation $$s_1 = \frac{1}{2}V_{ref}e^{j\theta(t)} \quad \theta(t) \leq \varphi_0$$
$$s_1 = \frac{1}{2}V_{ref}K(1-jB)e^{j\theta(t)} \quad \theta(t) > \varphi_0,$$

where $V_{ref}$ is a maximum amplitude of the digital input signal, θ is a phase modulation angle, t is a time, B is a shunt susceptance, K is defined by the equation $$K = \frac{1}{\sqrt{1+B^2}}$$

and $\phi_0$ is defined by the equation $$\varphi_0 = \cos^{-1}\frac{1}{\sqrt{1+B^2}}.$$

14. The method of claim 12, wherein the second CM signal is defined by the equation $$s_2 = \frac{1}{2}V_{ref}e^{-j\theta(t)} \quad \theta(t) \leq \varphi_0$$
$$s_2 = \frac{1}{2}V_{ref}K(1+jB)e^{-j\theta(t)} \quad \theta(t) > \varphi_0,$$

where $V_{ref}$ is a maximum amplitude of the digital input signal, θ is a phase modulation angle, t is a time, B is a shunt susceptance, K is defined by the equation $$K = \frac{1}{\sqrt{1+B^2}}$$

and $\phi_0$ is defined by the equation $$\varphi_0 = \cos^{-1}\frac{1}{\sqrt{1+B^2}}.$$

15. The method of claim 12, wherein the third CM signal is defined by the equation $$s_3 = \frac{1}{2} V_{ref} e^{j\theta(t)} \quad \theta(t) \leq \varphi_0$$

$$s_3 = \frac{1}{2} V_{ref} K(1+jB) e^{j\theta(t)} \quad \theta(t) > \varphi_0,$$

where $V_{ref}$ is a maximum amplitude of the digital input signal, $\theta$ is a phase modulation angle, t is a time, B is a shunt susceptance, K is defined by the equation $$K = \frac{1}{\sqrt{1+B^2}}$$

and $\varphi_0$ is defined by the equation $$\varphi_0 = \cos^{-1} \frac{1}{\sqrt{1+B^2}}.$$

16. The method of claim 12, wherein the fourth CM signal is defined by the equation $$s_4 = \frac{1}{2} V_{ref} e^{-j\theta(t)} \quad \theta(t) \leq \varphi_0$$

$$s_4 = \frac{1}{2} V_{ref} K(1-jB) e^{-j\theta(t)} \quad \theta(t) > \varphi_0,$$

where $V_{ref}$ is a maximum amplitude of the digital input signal, $\theta$ is a phase modulation angle, t is a time, B is a shunt susceptance, K is defined by the equation $$K = \frac{1}{\sqrt{1+B^2}}$$

and $\varphi_0$ is defined by the equation $$\varphi_0 = \cos^{-1} \frac{1}{\sqrt{1+B^2}}.$$

17. An outphasing transmitter to produce an output signal generated, at least in part, from a digital input signal, comprising:
a signal processing component operably coupled to the digital input signal, the processing component adapted to produce a first constant modulation (CM) signal, a second constant modulation (CM) signal, a third constant modulation (CM) signal or a fourth constant modulation (CM) signal from the digital input signal;
a plurality of digital-to-analog converters operably coupled to the signal processing component, each of the digital-to-analog converters adapted to convert a respective one of the first CM signal, the second CM signal, the third CM signal or the fourth CM signal from a digital state to an analog state;
a plurality of pulse shaping filters operably coupled to a respective one of the plurality of digital-to-analog converters, each of the pulse shaping filters adapted to filter a respective one of the first CM signal, the second CM signal, the third CM signal and the fourth CM signal to output a respective in-phase signal and a respective quadrature signal;
a plurality of quadrature modulators (QMs) operably coupled to two of the plurality of pulse shaping filters, each of the QMs adapted to modulate a respective one of the first in-phase signal and the first quadrature signal, the second in-phase signal and the second quadrature signal, the third in-phase signal and the third quadrature signal, and the fourth in-phase signal and the fourth quadrature signal to produce a first modulated signal, a second modulated signal, a third modulated signal or a fourth modulated signal;
a plurality of power amplifiers operably coupled to a respective one of the plurality of QMs, each of the power amplifiers adapted to amplify a respective one of the first modulated signal, the second modulated signal, the third modulated signal or the fourth modulated signal;
a first power combiner adapted to receive the first modulated signal and the second modulated signal, and further adapted to combine the first modulated signal and the second modulated signal to produce a first combined signal;
a second power combiner adapted to receive the third modulated signal and the fourth modulated signal, and further adapted to combine the third modulated signal and the fourth modulated signal to produce a second combined signal; and
a third power combiner adapted to receive the first combined signal and the second combined signal, and further adapted to combine the first combined signal and the second combined signal to produce the output signal.

18. The outphasing transmitter of claim 17, wherein the signal processing component comprises a digital signal processing component, a phase shifter component and/or a selective mapping component.

19. The outphasing transmitter of claim 18, wherein an optimal shunt susceptance B associated with the phase shifter component correlates to improved efficiency of the outphasing transmitter.

20. The outphasing transmitter of claim 17, wherein the signal processing component processes the digital input signal using a digital signal processing technique, a phase shifter technique and/or a selective mapping technique.

* * * * *

UNITED STATES PATENT AND TRADEMARK OFFICE
CERTIFICATE OF CORRECTION

| | |
|---|---|
| PATENT NO. | : 8,290,086 B2 |
| APPLICATION NO. | : 12/634251 |
| DATED | : October 16, 2012 |
| INVENTOR(S) | : Bose et al. |

It is certified that error appears in the above-identified patent and that said Letters Patent is hereby corrected as shown below:

On the Face Page, in Column 1, delete Field "(76)" and insert Field -- (75) --, therefor.

On the Face Page, in Field (56), under "OTHER PUBLICATIONS", in Column 1, Lines 1-2, delete "A .... Communications," and insert -- "A .... Communications," --, therefor.

On the Face Page, in Field (56), under "OTHER PUBLICATIONS", in Column 2, Line 1, delete "2009. DSP/SPE 2009." and insert -- 2009, DSP/SPE 2009, --, therefor.

On the Face Page, in Field (56), under "OTHER PUBLICATIONS", in Column 2, Lines 21-22, delete "A digital... amplifiers," and insert -- "A digital... amplifiers," --, therefor.

On the Face Page, in Field (56), under "OTHER PUBLICATIONS", in Column 2, Line 24, delete "Efficiency of outphasing RF poweramplifier systems," and insert -- "Efficiency of outphasing RF power amplifier systems," --, therefor.

On Page 2, in Field (56), under "OTHER PUBLICATIONS", in Column 1, Lines 1-2, delete "LINC ... optimization," and insert -- "LINC ... optimization," --, therefor.

On Page 2, in Field (56), under "OTHER PUBLICATIONS", in Column 1, Lines 4-5, delete "Reducing ... mapping," and insert -- "Reducing ... mapping," --, therefor.

On Page 2, in Field (56), under "OTHER PUBLICATIONS", in Column 1, Line 7, delete "RF ... communications," and insert -- "RF ... communications," --, therefor.

On Page 2, in Field (56), under "OTHER PUBLICATIONS", in Column 1, Line 12, delete "Microwave Engineering: Passive Circuits, 1998." and insert -- "Microwave Engineering: Passive Circuits," 1998, --, therefor.

Signed and Sealed this
Twenty-sixth Day of March, 2013

Teresa Stanek Rea
*Acting Director of the United States Patent and Trademark Office*

CERTIFICATE OF CORRECTION (continued)
U.S. Pat. No. 8,290,086 B2

On Page 2, in Field (56), under "OTHER PUBLICATIONS", in Column 1, Line 17, delete "Microwave ... edition)," and insert -- "Microwave ... edition)," --, therefor.

On Page 2, in Field (56), under "OTHER PUBLICATIONS", in Column 1, Line 24, delete "2009." and insert -- 2009, --, therefor.

On Page 2, in Field (56), under "OTHER PUBLICATIONS", in Column 2, Line 10, delete "Channels." and insert -- Channels, --, therefor.

In Column 6, Lines 30-32, in Eq. (4), delete "
$$\text{and} \begin{cases} s_2 = \frac{1}{2} V_{ref} e^{-j\theta(t)} & \theta(t)_i \leq \varphi_0 \\ s_2 = \frac{1}{2} V_{ref} K(1+jB) e^{-j\theta(t)} & \theta(t) > \varphi_0, \end{cases}$$
" and insert --
$$\text{and} \begin{cases} s_2 = \frac{1}{2} V_{ref} e^{-j\theta(t)} & \theta(t) \leq \varphi_0 \\ s_2 = \frac{1}{2} V_{ref} K(1+jB) e^{-j\theta(t)} & \theta(t) > \varphi_0, \end{cases}$$
--, therefor.

In Column 8, Lines 24-25, in Eq. 10, after Equation, insert -- . --.

In Column 9, Lines 8-9, delete "
$$\kappa = \int_{fc+5\Delta f - BW/2}^{fc+\Delta f + BW/2} E(f) df \,/\, \langle |\sin\theta|^2 \rangle$$
" and insert --
$$\kappa = \int_{fc+\Delta f - BW/2}^{fc+\Delta f + BW/2} E(f) df \,/\, \langle |\sin\theta|^2 \rangle$$
--, therefor.

In Column 9, Line 11, delete "$\xi = V_{ref}^2 / \langle |s_{in}|^2 \rangle.$" and insert -- $\zeta = V_{ref}^2 / \langle |s_{in}|^2 \rangle.$ --, therefor.

In Column 9, Line 13, delete "$\xi$" and insert -- $\zeta$ --, therefor.

In Column 9, Line 15, delete "$\xi$" and insert -- $\zeta$ --, therefor.

In Column 11, Lines 5-8, delete "
$$\begin{cases} s_4 = \frac{1}{2}V_{ref}e^{j\theta(t)} & \theta(t) \leq \varphi_0 \\ s_4 = \frac{1}{2}V_{ref}K(1+jB)e^{j\theta(t)} & \theta(t) > \varphi_0 \end{cases}$$
" and insert --
$$\begin{cases} s_4 = \frac{1}{2}V_{ref}e^{-j\theta(t)} & \theta(t) \leq \varphi_0 \\ s_4 = \frac{1}{2}V_{ref}K(1-jB)e^{-j\theta(t)} & \theta(t) > \varphi_0 \end{cases},$$
--, therefor.

In Column 13, Line 42, delete "1ncludes" and insert -- includes --, therefor.

In Column 16, Line 26, in Claim 7, delete "method claim" and insert -- method of claim --, therefor.

In Column 16, Lines 43-44, in Claim 8, delete "$a = -\exp\frac{-1}{2\sigma^2} - term1$" and insert -- $a = -\exp\frac{-1}{2\sigma^2} - term1$, --, therefor.

In Column 17, Lines 3-5, in Claim 10, delete "$a = -\exp\frac{-1}{2\sigma^2} - term1$" and insert -- $a = -\exp\frac{1}{2\sigma^2} - term1$, --, therefor.

In Column 19, Line 55, in Claim 17, delete "the processing" and insert -- the signal processing --, therefor.

UNITED STATES PATENT AND TRADEMARK OFFICE
CERTIFICATE OF CORRECTION

| | | |
|---|---|---|
| PATENT NO. | : 8,290,086 B2 | Page 1 of 1 |
| APPLICATION NO. | : 12/634251 | |
| DATED | : October 16, 2012 | |
| INVENTOR(S) | : Bose et al. | |

It is certified that error appears in the above-identified patent and that said Letters Patent is hereby corrected as shown below:

On the Title Page, in Column 1, below Item "(76)" insert -- (73) Assignee: Virginia Tech Intellectual Properties, Inc., Blacksburg, VA (US) --.

Signed and Sealed this
Twenty-fifth Day of June, 2013

Teresa Stanek Rea
*Acting Director of the United States Patent and Trademark Office*